United States Patent [19]
Lieber et al.

[11] Patent Number: 5,840,435
[45] Date of Patent: Nov. 24, 1998

[54] COVALENT CARBON NITRIDE MATERIAL COMPRISING $C_2N$ AND FORMATION METHOD

[75] Inventors: Charles M. Lieber, Lexington; Z. John Zhang; Chunming Niu, both of Somerville, all of Mass.

[73] Assignee: President and Fellows of Harvard College, Cambridge, Mass.

[21] Appl. No.: 477,194

[22] Filed: Jun. 7, 1995

Related U.S. Application Data

[63] Continuation-in-part of Ser. No. 145,967, Oct. 29, 1993, abandoned, which is a continuation-in-part of Ser. No. 92,020, Jul. 15, 1993, abandoned.

[51] Int. Cl.[6] ........................................... B32B 9/00
[52] U.S. Cl. ................. 428/698; 51/307; 51/309; 384/492; 428/336; 428/457; 428/469; 428/446; 423/414; 423/364
[58] Field of Search ............... 51/307, 309; 384/492; 423/364, 414; 428/336, 457, 469, 446, 698

[56] References Cited

U.S. PATENT DOCUMENTS

| | | | |
|---|---|---|---|
| 4,664,976 | 5/1987 | Kimura et al. | 428/698 |
| 4,925,829 | 5/1990 | Fujita et al. | 505/1 |
| 4,950,642 | 8/1990 | Okamoto et al. | 505/1 |
| 4,952,556 | 8/1990 | Mantese et al. | 505/1 |
| 4,959,345 | 9/1990 | Yamazaki | 505/1 |
| 5,096,882 | 3/1992 | Kato et al. | 505/1 |
| 5,110,679 | 5/1992 | Haller et al. | 428/408 |
| 5,158,931 | 10/1992 | Noda et al. | 505/1 |
| 5,169,829 | 12/1992 | Fujita et al. | 505/1 |
| 5,187,147 | 2/1993 | Ng et al. | 505/1 |
| 5,187,148 | 2/1993 | Yoshida et al. | 505/1 |
| 5,198,414 | 3/1993 | Ovshinsky et al. | 501/1 |
| 5,573,864 | 11/1996 | Kreider | 428/698 |
| 5,580,429 | 12/1996 | Chan et al. | 204/192.38 |

FOREIGN PATENT DOCUMENTS

| | | |
|---|---|---|
| 0439135 | 7/1991 | European Pat. Off. . |
| 0484809 | 5/1992 | European Pat. Off. . |
| 4167405 | 6/1992 | Japan . |
| 91/16196 | 10/1991 | WIPO . |

OTHER PUBLICATIONS

Krishnaswamy et al., "A New Laser/Plasma Ablation Technique for the Deposition Hard, Diamond Like Carbon Films," *Extended Abstracts*, 89(1):118, Abstract No. 79 (1989).

Sugimoto, Iwao and Satoko, Nakano, "Helium–Excited Reactive Magnetron Sputtering for Stress–Free Silicon Nitride Films," *Applied Physics Letters*, 62(17):2116–2118 (1993).

Sekine, T., et al., "A Graphitic Carbon Nitride," *National Institute for Research in Inorganic Materials*, 1376–1378 (1990).

Wixom, Michael, "Chemical Preparation and Shock Wave Compression of Carbon Nitride Precursors," *J. Am. Ceram. Soc.*, 73(7):1973–1978 (1990).

Liu, A.Y. and Cohen, M.L., "Structural Properties and Electronic Structure of Low–Compressibility Materials: $\beta$–$Si_3N_4$ and Hypothetical $\beta$–$C_3N_4$," *The American Physical Society*, 41(15):10727–10734 (1990).

*Primary Examiner*—Archene Turner
*Attorney, Agent, or Firm*—Hamilton, Brook, Smith & Reynolds, P.C.

[57] ABSTRACT

A nitride material comprises $C_2N$. A method of forming a covalent carbon material includes forming an atomic nitrogen source, forming an elemental reagent source and combining the atomic nitrogen, elemental reagent to form the covalent carbon material and annealing the covalent carbon material. The elemental reagent is reactive with the atomic nitrogen of the atomic nitrogen source to form the covalent carbon material. Annealing the covalent carbon material produces the $C_2N$. In one embodiment, essentially all carbon nitride chemical bonds are single or double bonds.

39 Claims, 3 Drawing Sheets

COVALENT CARBON NITRIDE MATERIAL COMPRISING $C_2N$ AND FORMATION METHOD

RELATED APPLICATIONS

This application is a Continuation-in-Part of Ser. No. 08/145,967, filed Oct. 29, 1993 now abandoned, which is a Continuation-in-Part of U.S. Ser. No. 08/092,020, filed Jul. 15, 1993, now abandoned, the teachings of all of which are incorporated by reference in their entirety.

GOVERNMENT SUPPORT

This invention was supported by the Air Force Office of Scientific Research, Grant No. F94620-940-10010, and the Government has certain rights to the invention.

BACKGROUND OF THE INVENTION

There is a great demand in industry for new materials. Of especial importance is development of materials which have extreme physical properties that can substitute for expensive known materials or push beyond the boundaries of currently available materials.

Carbon nitride solids have been the focus of considerable recent research efforts. Attempts to rationally combine carbon and nitrogen into solid materials and to elucidate the structures and physical properties of carbon nitride materials have included a variety of approaches including plasma-assisted chemical vapor deposition, thermal pyrolysis, shock wave compression, reactive sputtering and laser ablation techniques.

Theoretical investigations of carbon nitride solids have focused primarily on a hypothetical binary carbon nitrogen compound, $\beta$—$C_3N_4$. The results from the theoretical work suggested that $\beta$—$C_3N_4$ should have a reasonably large cohesive energy and should be metastable. There has been evidence for the formation of nanocrystalline $\beta$—$C_3N_4$ prepared by laser ablation and reactive sputtering, however, the overall composition of these materials has generally not had a molar ratio of carbon to nitrogen of 3:4, as would be expected. Furthermore, reported diffraction data of the isolated materials are not unique to the $\beta$—$C_3N_4$ structure and can be explained by a tetragonal carbon nitride phase, analogous to a high pressure form of germanium phosphide. Regardless, limitations of the utility and physical properties of existing carbon nitride solids have been associated with speculation regarding the empirical and structural nature of these solids.

Therefore, a need exists for an extended carbon nitride material and its preparation which overcomes or minimizes the above mentioned problems.

SUMMARY OF THE INVENTION

The present invention relates to a nitride material wherein at least a portion of the material has an empirical formula of $C_2N$, and to a method of forming the nitride material.

The method includes forming an atomic nitrogen source and an carbon reagent source. The elemental reagent source includes an elemental reagent, such as carbon, or pyrolytic graphite, which is reactive with atomic nitrogen of the atomic nitrogen source. The atomic nitrogen and the carbon reagent are combined to cause the atomic nitrogen and the elemental reagent to react and form a covalent carbon material. The covalent carbon material is then annealed, whereby at least a portion of the material has an empirical formula of $C_2N$.

Advantages of the method of the present invention include, for example, the ability to form a stable carbon nitride material of principle stoichiometry $C_2N$. Among the materials that can be formed are those, such as a covalent carbon material of the invention, wherein at least a portion of the material has an empirical formula of $C_2N$. Further, the covalent carbon materials of the invention can have superior physical properties, such as high resistivity and high thermal conductivity, and can be employed advantageously as substitutes for relatively expensive existing materials and for materials formed by known methods.

DETAILED DESCRIPTION OF THE INVENTION

The features and other details of the method of the invention will now be more particularly described with reference to the accompanying drawings and pointed out in the claims. It will be understood that the particular embodiments of the invention are shown by way of illustration and not as limitations of the invention. The principle features of this invention can be employed in various embodiments without departing from the scope of the invention.

Figure 1:
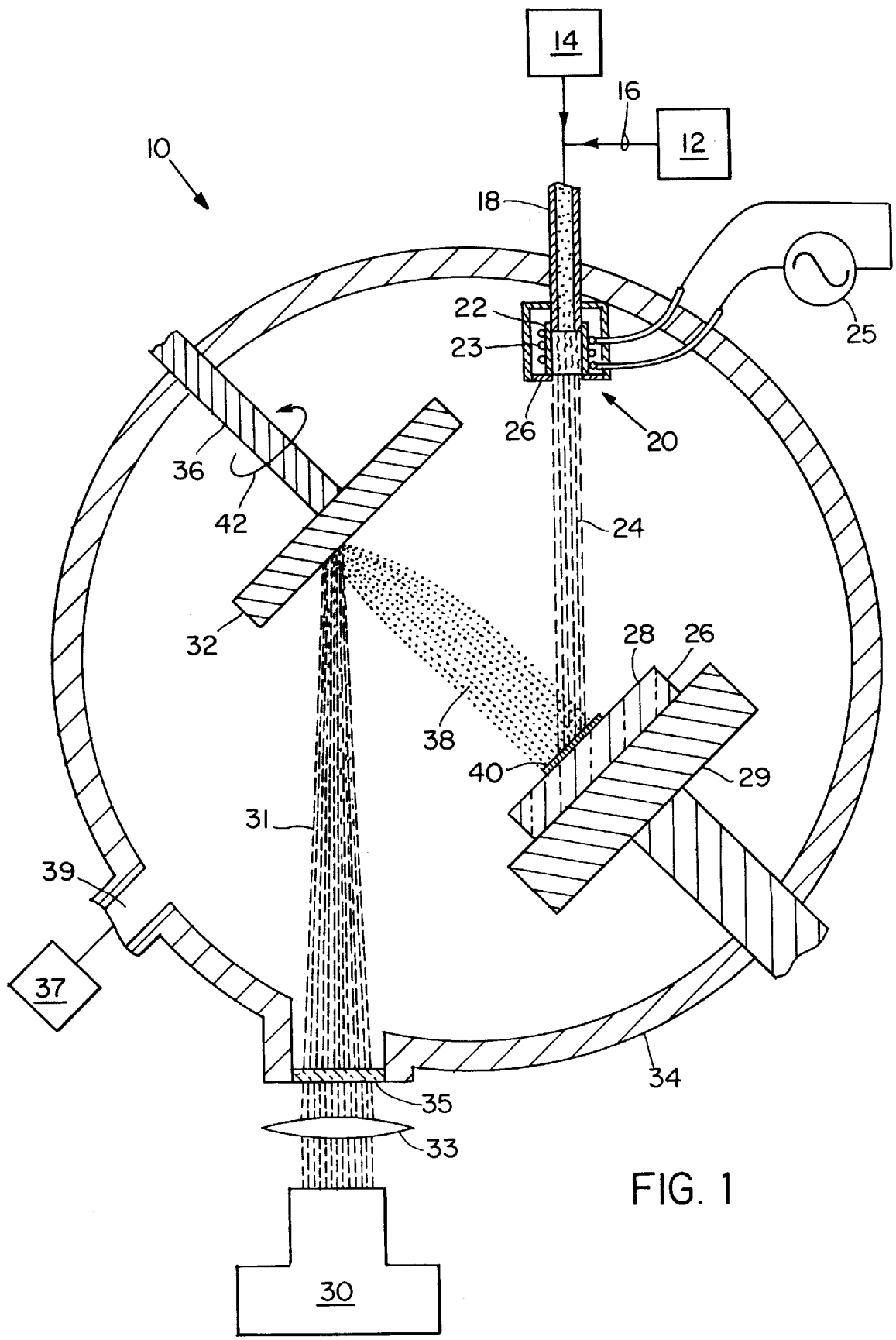
FIG. 1 is a plan view of an apparatus used in the preparation of $C_2N$ material.

The present invention includes a method for forming a covalent carbon material. An apparatus which can be used for the preparation of the invention is shown in FIG. 1. Apparatus 10 of FIG. 1 includes means for forming an atomic nitrogen source and means for forming an carbon source which is reactive with atomic nitrogen of the atomic nitrogen source to form the covalent carbon material.

Preferably, means for forming an atomic nitrogen source include nitrogen gas source 12 and inert gas source 14. An example of a suitable inert gas is helium. Conduits 16 and 18 extend from nitrogen gas source 12 and inert gas source 14, respectively, and intersect for combination of nitrogen and a suitable inert gas in conduit 18. Conduit 18 extends to radio-frequency discharge source 20. In a particularly preferred embodiment, radio frequency discharge 20 source includes aluminum oxide ($Al_2O_3$) nozzle 22 and coil 23. Coil 23 is connected to a suitable power source 25. Housing 26 extends about nozzle 22 and coil 23. An example of a suitable housing is a housing formed of copper (Cu). Radio frequency discharge source 20 is suitable for directing an atomic nitrogen source, such as atomic nitrogen beam 24 formed by exposure of nitrogen gas to radio-frequency discharge at radio-frequency discharge source 20, to substrate 26 at surface 28.

Substrate 26 is mounted on supporting heater 29. Examples of suitable substrates include Si(100), quartz and suitable metals, such as polycrystalline nickel, and metal nitrides (e.g., TiN, ZrN, NbN), etc. Suitable metal substrates can be at least one component of an article of manufacture, such as a cutting tool for material fabrication, or a bearing surface.

In one embodiment, means for forming the carbon reagent source include laser 30, which can form laser beam 31, and target 32. Examples of suitable lasers include Nd:YAG and excimer lasers. Lens 33 is positioned between laser 30 and window 35 of vessel 34. Lens 33 is suitable for focusing laser beam 31 onto target 32. Target 32 is formed of a suitable carbon material for forming a plume of carbon reagent which, when combined with the atomic nitrogen of the atomic nitrogen source, will react with the atomic nitrogen to form the covalent carbon material. Examples of suitable targets include graphite, glassy carbon, amorphous carbon, and diamond targets. A preferred target is graphite. A particularly preferred target is oriented pyrolytic graphite. Target 32 is mounted on rotating support 36.

Target 32 and substrate 28 are sealed within vessel 34. Vacuum source 37 extends from opening 39 of vessel 34. Target 32 is positioned in vessel 34, relative to laser 30 and substrate 26, to cause an ablation plume of elemental reagent, formed by ablation of target 32 with laser beam 31, to extend to surface 28 of substrate 26. In one embodiment, target 32 is substantially parallel to, and about four centimeters from, surface 28 of substrate 26.

In one embodiment of the method of the invention, helium, which has been seeded with nitrogen gas, and which is at relatively high pressure, such as about 50 and 300 Torr, is directed through aluminum oxide nozzle 22. Atomic nitrogen beam 24 is formed by exposure of the nitrogen gas to radio frequency (rf) discharge within aluminum oxide nozzle 22 of radio frequency discharge source 20. In one embodiment, the radio frequency discharge supplied to nitrogen passing through aluminum oxide nozzle 22 is sufficient to produce a flux of atomic nitrogen which is greater than about $10^{18}$ atoms $sr^{-1}s^{-1}$ and having kinetic energies less than about five electron volts. The atomic nitrogen beam is directed to surface 28 of substrate 26. Preferably, vacuum source 37 is activated to maintain the absolute pressure with vessel 34 in the range of between about $1\times10^{-8}$ and $1\times10^{-4}$ Torr.

A carbon reagent source is formed, such as by ablation of target 32, which is rotating, as indicated by arrow 42, with laser 30 to form ablation plume 38 of the carbon reagent. In the embodiment wherein the target is graphite, ablation plume 38 includes atomic carbon and carbon chains of various chain lengths.

The atomic nitrogen of the atomic nitrogen source, and the carbon reagent of the carbon reagent source, combine at substrate 24 to react and form covalent carbon material 40. The covalent carbon material is a carbon-nitrogen solid film. An "covalent carbon material," as that term is employed herein, means a continuous, as opposed to particulate or granular, solid phase that contains covalent bonds between carbon and nitrogen. In one embodiment, the covalent carbon material includes nitrogen compositions of at least about 35 percent. Alternatively, the covalent carbon material can include various impurities, such as elemental or molecular impurities. An example of such an impurity is oxygen that constitutes up to about five atomic percent of the material.

The relative amounts of the atomic nitrogen and carbon reagent which react to form the resulting carbon nitride material can be controlled, for example, by controlling the rate at which the atomic nitrogen source is formed and the relative rate at which the carbon reagent source is formed. In a particularly preferred embodiment, the relative rates at which the atomic nitrogen source and elemental carbon of an elemental carbon source are formed causes at least a portion of the resulting covalent carbon material, which is formed by reaction of the atomic nitrogen and elemental carbon reagent, to be a precursor for $C_2N$.

For example, the nitrogen gas content in the helium which can be subsequently exposed to radio frequency discharge that has a concentration in a range of between about one percent and about sixteen percent, by volume, of the combined nitrogen and helium gases. The radio frequency discharge can be about 150 watts, the substrate can be Si(100) or quartz, metal, or metal nitride, and the laser employed can be a Nd-YAG or excimer laser, that provides a wavelength of about 532 nm or 248 nm, respectively. A particularly preferred laser is Nd-YAG having a wavelength of about 532 rm. An example of other suitable laser includes a KrF excimer laser emitting a wavelength of about 248 nanometers. The laser output can be shifted by a suitable nonlinear optical technique.

A ten millimeter diameter gaussian output from the laser is focused to a spot on a graphite target surface having a diameter of about two millimeter diameter and at a position off the rotation axis of the target. Preferably, the resulting atomic nitrogen beam and the ablation plume accumulate on the substrate, which is heated to a temperature of about 200° C. by supporting heater 29, to form a covalent carbon nitride film having a thickness in the range of between about 0.1 and about five microns.

The covalent carbon material is then annealed at a temperature between about 300° C. and about 700° C. and pressure of between about $1\times10^{-9}$ and about 760 torr for a period of time between about 0.5 and about 24 hours. The atmosphere is inert. Suitable inert atmospheres include argon gas and nitrogen gas. The material formed by the annealing process can be described as $C_2N$. Preferably, the covalent carbon material can be annealed at a temperature of about 550° C. for about three hours and at a pressure of about $1\times10^{-7}$ torr. In a particularly preferred embodiment, the carbon nitride material is annealed in a vacuum environment.

Figure 3:
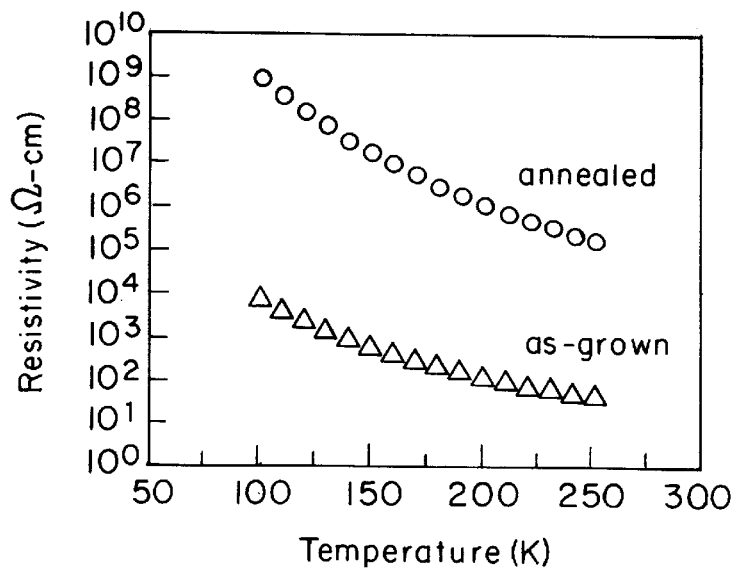
FIG. 3 is a plot of electrical resistivity versus percentage of nitrogen.

The annealed covalent carbon material ($C_2N$) typically has a high electrical resistivity and high thermal conductivity. The term "high electrical resistivity" is in comparison to a carbon nitride material that has been annealed (See FIG. 3). In one embodiment, the electrical resistivity of the carbon nitride material is greater than about $1\times10^3$ $\Omega$-cm. Preferably, the electrical resistivity of the carbon nitride mate of the invention is greater than about $1\times10^5$ $\Omega$-cm. In a particularly preferred embodiment, the annealed covalent carbon material has a electrical resistivity of between about $1\times10^5$ and about $1\times10^{10}$ $\Omega$-cm. The term "high thermal conductivity," as that term is employed herein, means greater than about 0.7 W/m-k. Preferably, the annealed covalent carbon material has a thermal conductivity of between about 0.8 and about 1.5 W/m-k.

In one embodiment, the annealed covalent carbon material substantially comprises C—N and C=N bonds. In one embodiment, the annealed material contains less than about 5% cyanogen-like impurities. In another embodiment, essentially all carbon nitride chemical bonds are single or double bonds. Preferably, there are essentially no cyanogen or cyanogen-like impurities, such as those that have an IR characteristic absorbance at about 2200 $cm^{-1}$.

The invention will now be further and specifically described by the following examples. All parts and percentages are by weight unless otherwise stated.

Exemplification

Carbon nitride thin films were prepared by combining pulsed laser ablation with an atomic beam source. (C. M.

Lieber and Z. J. Zhang, *Adv. Mater.* 6:497 (1994); C. Niu, Y. Z. Lu and C. M. Lieber, *Science*, 261:334 (1993)). The experimental set-up is schematically shown in FIG. 1. Carbon fragments were produced by ablation of high purity pyrolytic graphite in a vacuum chamber using either a frequency-doubled Nd:YAG laser (532 nm) or a KrF excimer laser (248 nm). The base pressure of this chamber was below $10^{-8}$ torr, and the working pressure was usually between $10^{-5}$ to $10^{-4}$ torr. A $N_2$-seeded He flow was passed through a radio frequency (rf) discharge source to generate a reactive nitrogen beam that consisted primarily of atomic nitrogen. The reactive nitrogen atom beam ($>10^{18}$ atoms/sr-s) intersected the carbon ablation plum at the substrate surface. The optimal nitrogen beam conditions used in these studies had previously been determined. Using this experimental apparatus only pure carbon and nitrogen reactants were produced. Elemental impurities, such as hydrogen and oxygen, were eliminated by this technique. The carbon nitride thin films were grown either on quartz or HF-etched Si (100) surfaces at ~200° C. As-grown films were annealed in a vacuum $10^{-8}$–$10^{-7}$ torr at 550° C. for three hours.

Figure 2A:
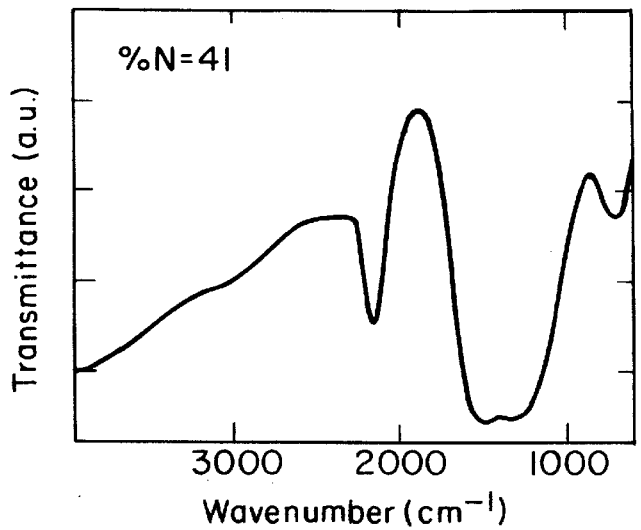
FIG. 2A is an infrared spectra of a carbon nitride material before annealing.

(IR) infrared spectroscopy was used to evaluate the phases present in the covalent carbon materials. A typical IR spectrum recorded from a nitride film containing 41 percent nitrogen is shown in FIG. 2A. The spectrum exhibited two overlapping bands at ~1500 and 1350 $cm^{-1}$ and a third stretching mode at ~2200 $cm^{-1}$. The overlapping bands at ~1500 and 1350 $cm^{-1}$ correspond to C=N and C—N stretching modes and were consistent with a covalent inorganic carbon nitride solid.

The third band occurring at ~2200 $cm^{-1}$ corresponded to a C≡N (cyanogen) or a cyanogen-like stretching mode. The C≡N bonding arrangement precluded an extended covalent inorganic carbon nitride solid and represented a cyanogen-like impurity phase in the materials. The cyanogen-like impurity increased very little as the nitrogen composition increased from 30–35 percent. However, as the nitrogen composition increased above 35 percent, the intensity of the ~2200 $cm^{-1}$ band increased dramatically.

Figure 2B:
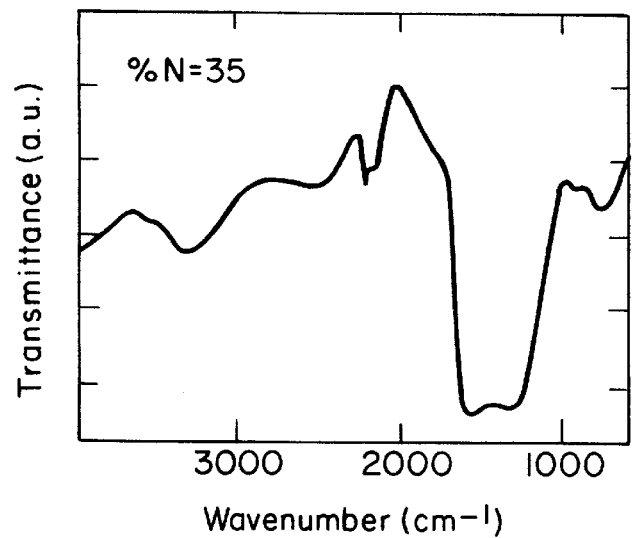
FIG. 2B is an infrared spectra of a carbon nitride material after annealing.

Investigation of the effects of thermal annealing of the nitride thin films showed changes on the structure and composition of the nitride thin films. Evaluation of the films before and after the annealing process by IR and RBS showed that the intense C≡N mode at ~2200 $cm^{-1}$ was nearly eliminated as seen in FIG. 2B. RBS analysis showed that the nitrogen composition in the annealed film was reduced from 41 to 35 percent. These results indicated that a nearly single phase $C_2N$ material containing 35 percent nitrogen and both C—N and C=N bonding could be prepared by a post-annealing process.

The thermal annealing process resulted in changes in electrical properties of the carbon nitride films. Resistivity measurements made on thin films that were deposited on insulating quartz substrates showed that the resistivity of the carbon nitride films increased systematically with nitrogen composition, although this increase was highly nonlinear. The resistivity at 200° K. initially increased slowly until the nitrogen composition reached 30%, and then increased much more rapidly until it ultimately saturated at 1–5×$10^3$ $\Omega$-cm in films with a nitrogen composition of ~45%. It is believed that the initial slow increase in resistivity corresponds to transport dominated by amorphous carbon, and that the saturation value corresponds to the resistivity of the carbon nitride (but a form that also contains a —C≡N, or cyanogen-like impurity phase).

Figure 4:
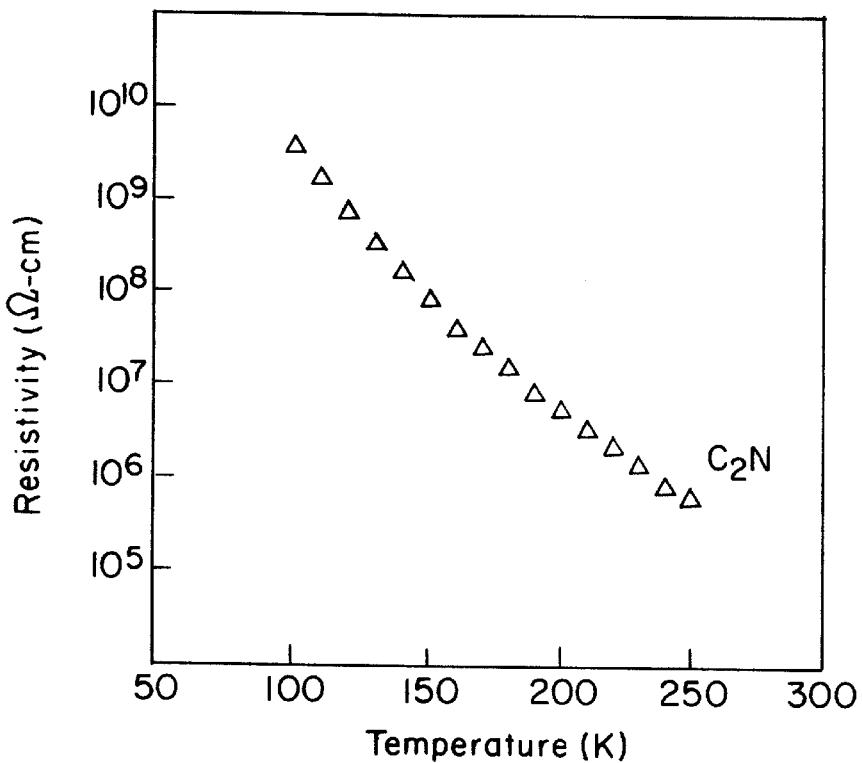
FIG. 4 is a plot of electrical resistivity of $C_2N$.

Significantly, carbon nitride films that contained initially ≧40% nitrogen exhibited a high resistivity after the vacuum annealing treatment. Temperature dependent resistivity measurements performed on a carbon nitride film containing 45% nitrogen before annealing and 35% nitrogen after vacuum annealing at 550° C. were shown in FIG. 3. Temperature dependent resistivity data of the $C_2N$ carbon nitride material produced by annealing carbon nitride samples containing initially ≧40% nitrogen are shown in FIG. 4.

The resistivity of the film increased 3–5 orders of magnitude after the annealing process. It is believed that the enhancement in resistivity values for the post-annealed carbon nitride films is due to the elimination of the cyanogen impurity phase since this phase can increase the density of states at the Fermi level. The stability of the carbon nitride electrical properties to thermal processing make this material an attractive candidate for microelectronics applications.

Figure 5:
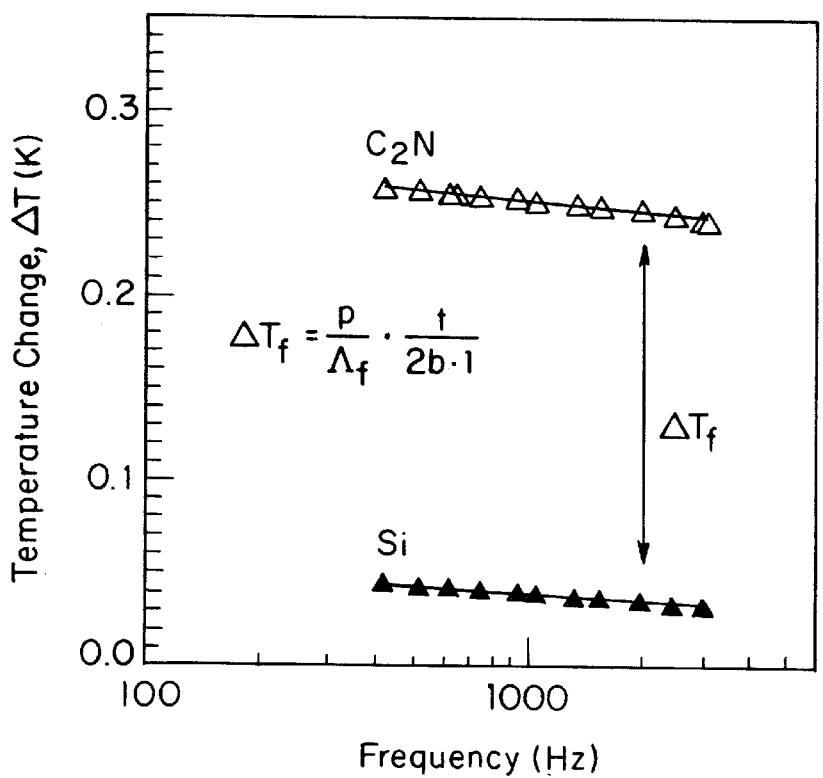
FIG. 5 is a plot of thermal conductivity of $C_2N$.

Investigation of the thermal conductivity of these films was undertaken since the ability of carbon nitride to transport heat efficiently was an important consideration for potential applications such as microelectronics. The thermal conductivity of these carbon nitride thin films was measured using an well-established ac ($3\omega$) electrical technique. A thick and narrow gold line was deposited onto carbon nitride thin films grown on silicon substrates, and this metal line, which served as both a heater and temperature sensing element, was used to determine the thermal conduction through the film. Significantly, the thermal conductivity calculated for the carbon nitride film from this data, 0.8 to 1.3 W/m-K was among the highest observed for any type of amorphous material. These results are shown in FIG. 5.

Equivalents

Those skilled in the art will recognize, or be able to ascertain using no more than routine experimentation, many equivalents to specific embodiments of the invention described specifically herein. Such equivalents are intended to be encompassed in the scope of the following claims.

What is claimed is:

1. A composition comprising $C_2N$.

2. A nitride material wherein at least a portion of the material has an empirical formula of $C_2N$.

3. A nitride material of claim 2 wherein the material is a film.

4. A nitride material of claim 3 wherein at least 10% of the film has an empirical formula of $C_2N$.

5. A nitride material of claim 3 wherein at least 20% of the film has an empirical formula of $C_2N$.

6. A nitride material of claim 3 wherein at least 50% of the film has an empirical formula of $C_2N$.

7. A nitride material of claim 6 wherein the film includes less than about five percent oxygen.

8. A nitride material of claim 3 wherein essentially all of the film has an empirical formula of $C_2N$.

9. A nitride material of claim 8 wherein the film has a thickness in the range of between about 0.1 and five microns.

10. A nitride material of claim 2 wherein said material has a high electrical resistivity.

11. A nitride material of claim 10 wherein said material has an electrical resistivity of greater than about $1\times10^5$ $\Omega$-cm.

12. A nitride material of claim 2 wherein said material has a high thermal conductivity.

13. A nitride material of claim 12 wherein said thermal conductivity is between about 0.8 and 1.3 with W/m-k.

14. A nitride material of claim 2 wherein said covalent nitride material substantially comprises C—N and C=N bonding.

15. A nitride material of claim 14 wherein essentially all carbon nitride chemical bonds are single or double bonds.

16. A nitride material of claim 2 wherein said material includes at least about 35 atomic percent nitrogen.

17. A composite, comprising:
   a) a substrate; and
   b) an covalent nitride material on said substrate, at least a portion of said covalent nitride material having an empirical formula of $C_2N$.

18. A composite of claim 17 wherein the covalent nitride material is a film.

19. A composite of claim 18 wherein the substrate includes silicon.

20. A composite of claim 18 wherein the substrate includes quartz.

21. A composite of claim 18 wherein the substrate includes Ni-metal.

22. A composite of claim 18, wherein the substrate includes titanium nitride.

23. A composite of claim 18, wherein the substrate includes NbN.

24. A composite of claim 18 wherein said composite has a high electrical resistivity.

25. A composite of claim 18 wherein said composite has a high thermal conductivity.

26. A composite of claim 19 wherein essentially all carbon nitride chemical bonds of said film are single or double bonds.

27. A composite of claim 18 wherein the substrate includes at least one bearing surface.

28. A composite of claim 19 wherein essentially all of the film has an empirical formula of $C_2N$.

29. A composite of claim 19 wherein the film has a thickness in a range of between about 0.1 and five microns.

30. A nitride material wherein at least a portion of said material has an empirical formula of $C_2N$, the material being formed by a method comprising the steps of:
   a) forming an atomic nitrogen source;
   b) forming an elemental carbon source, said elemental carbon source including elemental carbon which is reactive with atomic nitrogen of said atomic nitrogen source to form the covalent carbon nitride material;
   c) combining the atomic nitrogen and the elemental carbon to cause the atomic nitrogen and the elemental carbon to react and form a covalent carbon nitride material; and
   d) annealing said covalent carbon nitride material, whereby an annealed covalent carbon nitride material is formed wherein at least a portion of said annealed covalent carbon nitride material has an empirical formula of $C_2N$.

31. An annealed covalent carbon nitride material of claim 30 wherein the material contains at least about 35 percent nitrogen.

32. An annealed covalent carbon nitride material of claim 30 wherein the material substantially comprises C—N and C=N bonding.

33. An annealed covalent carbon nitride material of claim 32 wherein essentially all carbon nitride chemical bonds of the annealed extended material are single or double bonds.

34. An annealed covalent carbon nitride material of claim 30 wherein said covalent carbon nitride material is annealed at a temperature in a range of between about 300° and about 700° C.

35. An annealed covalent carbon nitride material of claim 34 wherein said covalent carbon nitride material is annealed at a temperature of about 550° C.

36. An annealed covalent carbon nitride material of claim 35 wherein said covalent carbon nitride material is annealed for a period of time in a range of between about 0.5 and 24 hours.

37. An annealed covalent carbon nitride material of claim 36 wherein said covalent carbon nitride material is annealed for about three hours.

38. A composite of claim 21 wherein the substrate includes polycrystalline nickel.

39. A composite of claim 18 wherein the substrate is at least one component of a cutting tool.

* * * * *